United States Patent
Casey

(10) Patent No.: US 7,923,751 B2
(45) Date of Patent: Apr. 12, 2011

(54) BIPOLAR TRANSISTOR WITH A LOW SATURATION VOLTAGE

(75) Inventor: David Casey, Oldham (GB)

(73) Assignee: Zetex PLC, Oldham (GB)

( * ) Notice: Subject to any disclaimer, the term of this patent is extended or adjusted under 35 U.S.C. 154(b) by 0 days.

(21) Appl. No.: 10/566,813

(22) PCT Filed: Jul. 12, 2004

(86) PCT No.: PCT/GB2004/003018
§ 371 (c)(1),
(2), (4) Date: Jan. 30, 2006

(87) PCT Pub. No.: WO2005/015641
PCT Pub. Date: Feb. 17, 2005

(65) Prior Publication Data
US 2006/0208277 A1 Sep. 21, 2006

(30) Foreign Application Priority Data
Aug. 2, 2003 (GB) .................. 0318146.8

(51) Int. Cl.
*H01L 29/02* (2006.01)
(52) U.S. Cl. .............. 257/164; 257/197; 257/565
(58) Field of Classification Search .............. 257/565, 257/197, 164
See application file for complete search history.

(56) References Cited

U.S. PATENT DOCUMENTS

| 3,678,348 | A | 7/1972 | Reber et al. |
| 4,205,332 | A | 5/1980 | Conti et al. |
| 4,236,171 | A | 11/1980 | Shen |
| 4,516,149 | A | 5/1985 | Wakui et al. |
| 4,717,680 | A | 1/1988 | Piotrowski |
| 4,835,588 | A | 5/1989 | Nawata et al. |
| 5,229,313 | A | 7/1993 | Takata |
| 5,408,124 | A * | 4/1995 | Palara ............ 257/580 |
| 6,064,080 | A | 5/2000 | Nakamura |
| 6,388,272 | B1 * | 5/2002 | Odekirk ............ 257/77 |
| 7,404,249 | B2 * | 7/2008 | Gardes et al. ........ 29/602.1 |
| 2002/0024114 | A1 * | 2/2002 | Sakamoto ........... 257/565 |
| 2005/0269633 | A1 * | 12/2005 | Singh .............. 257/336 |

FOREIGN PATENT DOCUMENTS

| EP | 0 341 221 | 11/1989 |
| GB | 2 081 009 A | 2/1982 |
| JP | 61-212061 | 9/1986 |
| JP | 62-244170 | 10/1987 |
| JP | 2003-218231 | 7/2003 |

OTHER PUBLICATIONS

UK Search Report dated Jan. 30, 2004 for application No. GB 0318146.8.
Proceedings of 2001 International Symposium on Power Semiconductor Devices & ICs, Osaka—1.8 kV, 3.8 A Bipolar Junction Transistors in 4H-SiC—Sei-Hyung Ryu, Anant K. Agarwal, John W. Palmour, and Michael E. Levinshtein—pp. 37-40.
PCT International Search Report dated Sep. 2, 2004 for PCT/GB2004/003018.

* cited by examiner

Primary Examiner — N Drew Richards
Assistant Examiner — Jae Lee
(74) Attorney, Agent, or Firm — Foley & Lardner LLP

(57) ABSTRACT

A bipolar transistor with a specific area resistance less than about 500 mOhms·mm² comprises a first semiconductor region of a first conductivity type defining a collector region (2). A second semiconductor region of a second conductivity type defines a base region (3). A third semiconductor region of the first conductivity type defines an emitter region (4). A metal layer provides contacts (6, 7) to said base (3) and emitter regions (4). The metal layer has thickness greater than about 3 μm.

14 Claims, 1 Drawing Sheet

BIPOLAR TRANSISTOR WITH A LOW SATURATION VOLTAGE

Figure 1:
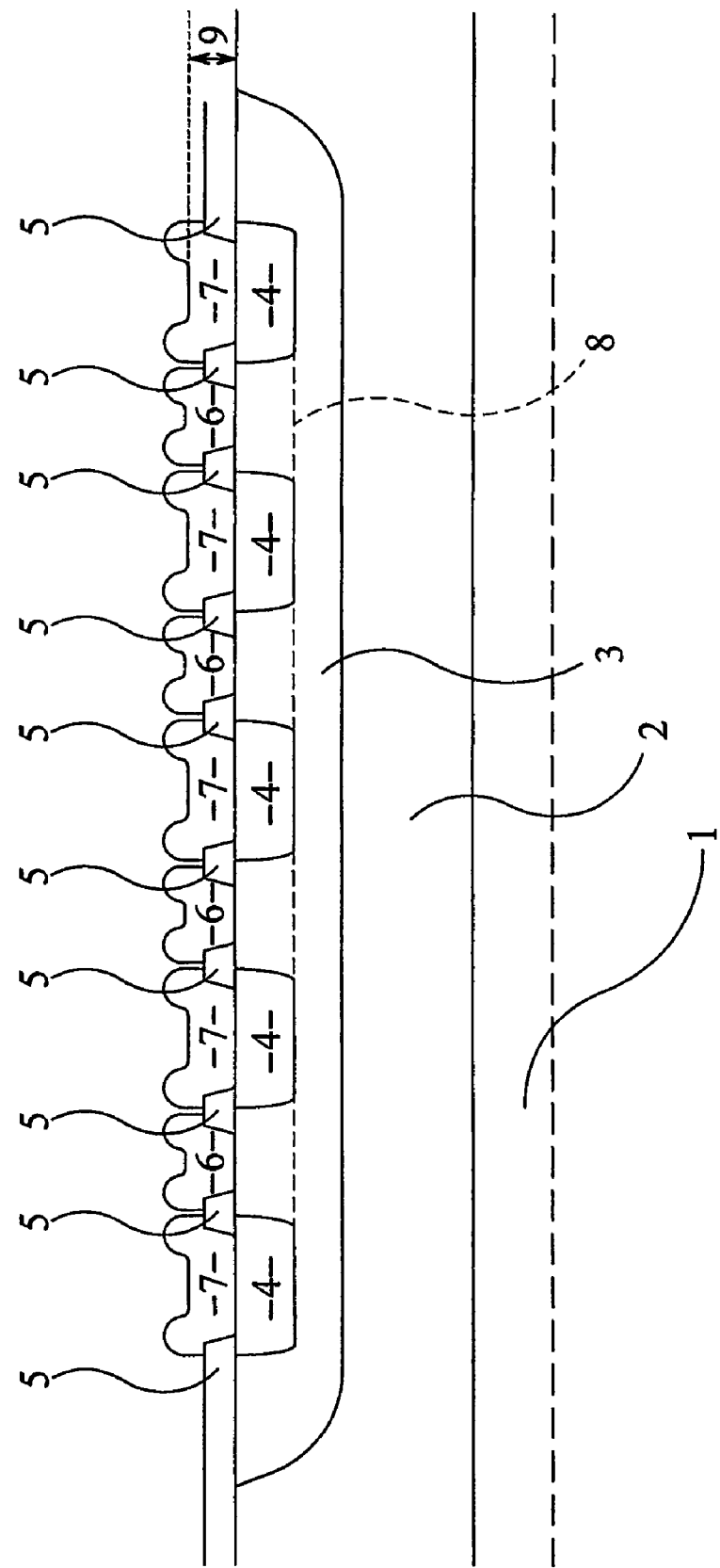

The present invention relates to a bipolar transistor with a low saturation voltage.

With bipolar transistors, the collector-emitter saturation voltage is a key parameter determining the power loss of the transistor and its efficiency. In a circuit where the bipolar transistor is operated as a saturated switch a small base current is used to switch on a much larger collector to emitter current, the size of this current being determined by the voltage supply and the load resistance connected to either the collector or the emitter. When a bipolar transistor is operated in saturation the voltage drop from the collector to the emitter is reduced to a minimum value known as the saturation voltage $V_{CE(sat)}$. It is desirable to reduce this saturation voltage to as low a value as possible in order to minimise the power loss within the transistor.

There a number of known techniques to reduce the saturation voltage for a bipolar transistor, through either ensuring that the emitter/base junction is biased as evenly as possible across the whole junction area, or reducing the parasitic series resistance from the collector contact to the emitter contact.

In order to switch on the transistor a certain minimum voltage bias must be applied to the junction. If the junction is unevenly biased, then in some regions of the junction of the transistor will not be switched on, resulting in inefficient use of the silicon area. This increases the resistance of the transistor between the collector and the emitter when the transmitter is in the on state, resulting in a rise in the saturation voltage.

One known approach to address this problem is to provide frequent contacts to the base region through the emitter region to reduce the lateral resistance of the base layer extending under the emitter layer between these two points. A low lateral resistance is required so that the emitter/base bias voltage is not reduced in the centre of the emitter region remote from the base contact. However, it is desirable to achieve this effect without significantly affecting the percentage of the emitter/base junction area left intact as this results in either a reduced emitter/base junction area or an enlarged transistor to maintain the same junction area.

Various approaches are known to reduce the lateral resistance of the base region such as creating striped contacts to the base region through the emitter region. However, this significantly reduces the area of the emitter/base junction with the disadvantages described above. A better approach is to provide an array of contacts to the base region through holes in the emitter region. These holes may typically be spaced less than 75 μm apart, providing a good compromise between reducing the lateral resistance of the base region and maintaining the size of the emitter/base junction.

Reductions in the parasitic series resistance between the collector contact and the emitter contact of the transistor can be achieved in a number of ways. Using a low resistivity semiconductor (e.g. less than 5 mOhm·cm) within the substrate reduces the resistance of the substrate. Additionally the thickness of the substrate and the epitaxial layers may be reduced. There is a trade off to be made when determining the thickness of the epitaxial collector layer as in the transistor off state this layer supports the widened depletion layer around the base/collector junction. The thinner the layer, the lower the transistor breakdown voltage will be. In the on state the depletion region collapses and the epitaxial layer represents just parasitic series resistance, proportional to its thickness, increasing the saturation voltage. An optimal epitaxial layer doping profile and thickness has to be obtained in order to achieve the optimal trade off between breakdown voltage performance and saturation voltage. The resistance of the wires connecting to the emitter, base and collector contact tracks can be reduced by using thick and/or multiple bond wires.

The current flow may be more evenly distributed and the voltage drops along the tracks reduced by altering the layout of the tracks. It is important to reduce the voltage drops in the tracks connecting to the emitter contacts as these directly contribute to the on resistance, reducing the saturation voltage.

Transistors incorporating some or all of the above techniques to reduce the saturation voltage are well known. The saturation voltage of a transistor can be measured in terms of the specific area resistance of the transistor. The specific area resistance of a transistor is a well known term within the power semiconductor industry and refers to the product of the on resistance of the transistor (in the case of a bipolar transistor the collector to emitter resistance) multiplied by the area of the transistor. It is a figure of merit by which differing transistors may be compared, in respect of the on resistance and the area. The saturation voltage is equal to the on resistance of the transistor multiplied by the collector to emitter current.

Low $V_{CE(sat)}$ transistors with specific area resistances of below 500 mOhm·mm² are now widely available. Nevertheless it remains desirable to find new ways of reducing the $V_{CE(sat)}$ of bipolar transistors. Accordingly it is an object of the present invention is to provide a new approach to reducing the specific area resistance and thus $V_{CE(sat)}$ of bipolar transistors.

According to the present invention there is provided a bipolar transistor, comprising:

a first semiconductor region of a first conductivity type defining a collector region;

a second semiconductor region of a second conductivity type defining a base region;

a third semiconductor region of said first conductivity type defining a emitter region; and a metal layer providing contacts to said base and emitter regions;

wherein the transistor has a specific area resistance less than about 500 mOhms·mm²; and wherein said metal layer has a thickness greater than about 3 μm.

The present inventors have recognised that in addition to reducing voltage drops in the metal tracks connecting to the emitter contacts, it is equally important to reduce the voltage drops in the metal tracks connecting to the base contacts as these serve to reduce the bias voltage applied to the emitter/base junction, potentially resulting in the junction being unevenly biased. The present inventors have shown that increasing the metal contact thickness of a low saturation voltage transistor in accordance with the present invention can provide significant further reductions in saturation voltage. That is, with the present invention it is possible to achieve further reductions in the saturation voltage of a bipolar transistor above and beyond those reductions achieved through the application of prior art techniques as discussed above. This is achieved with minimal alteration to the design of the existing transistor, such that this approach may be applied to existing bipolar transistor designs with minimal alteration to the fabrication process, and hence minimal cost.

The present invention provides significant reductions in saturation voltage for bipolar transistors which would have a specific area resistance less than about 500 mOhms·mm² with a conventional metal layer less than 3 μm thick. Improvements in saturation voltage may be even more marked with transistors having specific area resistances less than 300 mOhms·mm². Additional reductions in saturation voltage of the order of 30% have been measured for transistors which would have a specific area resistance less about 200 mOhms·mm² with a metal layer less than 3 μm thick.

It is preferable that the metal layer has a substantially uniform thickness greater than 3 μm, or if not uniform has a minimum thickness greater than 3 μm. Typically the metal layer will be less than 10 μm thick.

In a preferred embodiment the emitter region defines a first surface, the base region extending to said surface in locations defined by apertures through emitter region, said metal layer overlying said first surface. The apertures are preferably spaced less than 100 μm from each other.

Other objects and advantages of the present invention will become apparent from the following description.

A specific embodiment of the present invention will now be described, by way of example only, with reference to the accompanying drawing.

The illustrated bipolar transistor comprises a substrate 1, an epitaxial collector layer 2, a base region 3, emitter regions 4, oxide layer 5, base metal contacts 6 and emitter metal contacts 7.

The transistor is built upon a substrate 1 of a first conductivity type. An epitaxial layer 2 constituting the collector region of the first conductivity type is grown upon the substrate 1. A base region 3 of a second and opposite conductivity type is formed into the epitaxial layer 2 and within the base region 3 areas of emitter regions 4 of the first conductivity type are formed. In the preferred embodiment of the present invention illustrated the emitter regions 4 are formed in a substantially continuous layer into the central portion of the base region 3, with the exception of an array of holes in the layer where no emitter doping takes place. The effect is that there is a regular array of circular holes in the emitter region 4 where the base region 3 extends to the surface of the emitter region 4. These holes are typically positioned approximately 75 μm apart in a rectangular grid. Other patterns that ensure regular contact to the base region, without significantly reducing the area of the emitter region 4/base region 3 junction are possible.

The drawing shows a cross sectional view of the bipolar transistor intersecting one row of this array of holes. The dashed line 8 indicates that remote from the holes where the base region 3 extends to the top of the emitter region 4 the coverage of the emitter region 4 is continuous over the base region 3. Over the top of the semiconductor layers a pattern of silicon oxide layer 5 is deposited and patterned bridging the upper edge of the boundary between the emitter region 4 and the base region 3. Interspersed between the oxide layer 5 are base metal contacts 6 and emitter metal contacts 7, separated from each other by the patterned oxide layer. 5 and in electrical contact with the base region 6 and the emitter region 7 respectively. The collector connection is taken from the side of the substrate remote from the emitter regions.

As so far described, the bipolar transistor is entirely conventional and may be fabricated in an entirely conventional manner. However, in accordance with the present invention the metal layer contacts to the base and emitter regions are thicker than is conventional, i.e. greater than 3 μm thick. Similarly, the emitter region metal layer contacts may be of an increased thickness.

The thickness of the metal layer defining the base contacts 6 and emitter contacts 7 is chosen in order to help ensure more even biasing of the emitter region 4/base region 3 junction to reduce the parasitic voltage drop across the emitter metal contacts 7. Reducing the voltage drop in the tracks leading to the diverse base region contacts ensures that the voltage bias applied to the emitter/base junction is more evenly distributed, this ensures more even current density across the transistor, reducing the saturation resistance.

The inventors of the present invention have demonstrated that this seemingly simple expedient, when applied to a bipolar transistor already designed to have a low $V_{CE(sat)}$ (i.e. a specific area resistance less than about 500 mOhms·mm², can provided further reductions in $V_{CE(sat)}$ of up to around 30%.

A bipolar transistor in accordance with the present invention will typically incorporate the prior art techniques described above to minimise the saturation voltage. In the specific embodiment, the array of contacts to the base region is designed to help ensure that the emitter/base junction remains evenly biased, low resistivity thin substrates are utilised and the epitaxial layer thickness and doping profile are chosen to reduce the resistance in the transistor on state. Additionally, the layout of the metal tracks is designed to help reduce the voltage drop along their lengths and the wire bonds to the tracks are constructed using thick and/or multiple wires. The effect is such that the saturation voltage of the bipolar transistor is reduced below the level achievable by the prior art alone.

A bipolar transistor not already optimised for low saturation voltage (i.e. with a specific area resistance greater than about 500 mOhms·mm²) would show no significant improvement to the saturation voltage by thickening the metal contact in accordance with the present invention since the saturation voltage is affected more by the other parameters described above than by the thickness of the metal contacts. With bipolar transistor designs already optimised for low saturation voltage increasing the thickness of the metal contacts further reduces the saturation voltage. This reduction in saturation voltage is progressive and proportional to the thickness of the metal contact and track. Significant improvements to the saturation voltage have been observed with a metal thickness of between 4 μm and 6 μm, with 6 μm, the preferable thickness, reducing the saturation voltage of a bipolar transistor optimised for low saturation performance by a up to a further 30%.

It will be appreciated that the present invention is described in connection with a specific vertical bipolar transistor, optimised for low saturation voltage through existing known techniques. Thicker metal layers may be applied to any bipolar transistor design where it is desirable to reduce the voltage drop in the metal contact tracks in order to ensure more even biasing of the emitter/base junction.

The present invention offers improved performance for any power switching application where the circuit efficiency is dependent on the saturation voltage. Effectively this extends to all applications where the transistor is used in saturation rather than as a linear switch.

Further possible modifications and applications of the present invention will be readily apparent to the appropriate skilled person.

The invention claimed is:

1. A bipolar transistor suitable for operation as a saturated switch comprising:
    a first semiconductor region of a first conductivity type defining a collector region;
    a second semiconductor region of a second conductivity type defining a base region;
    a third semiconductor region of said first conductivity type defining a emitter region; and
    a metal layer providing metal track contacts that directly contact the base region and the emitter region;

wherein the emitter region defines a first surface, the base region extending to the first surface in locations defined by apertures through the emitter region, the metal layer overlying the first surface;

wherein the bipolar transistor has a specific area resistance less than 500mOhms·mm$^2$;

wherein the metal layer has a thickness that is substantially uniformly greater than 3 μm; and wherein voltage drops in the metal track contacts, which contact the base region and the emitter region, are reduced when the bipolar transistor is in an on state to distribute a voltage bias to a junction of the base region and the emitter region such that saturation resistance is reduced by an amount greater than 0% and up to 30% compared to the same bipolar transistor having a metal layer of thickness less than 3 μm.

2. A bipolar transistor according to claim 1, wherein the thickness of the metal layer is no less than 4 μm.

3. A bipolar transistor according to claim 1, wherein the thickness of the metal layer is no less than 6 μm.

4. A bipolar transistor according to claim 1, wherein adjacent apertures are spaced less than 100 μm from each other.

5. A bipolar transistor according to claim 2, wherein adjacent apertures are spaced less than 100 μm from each other.

6. A bipolar transistor according to claim 3, wherein adjacent apertures are spaced less than 100 μm from each other.

7. A bipolar transistor according to claim 2, wherein the thickness of the metal layer is no less than 6 μm.

8. A bipolar transistor according to claim 1, wherein at least some of the metal track contacts directly contact the base region.

9. A bipolar transistor according to claim 1, wherein the metal track contacts comprise base metal contacts and emitter metal contacts, the base metal contacts for contacting the base region, the emitter metal contacts for contacting the emitter region.

10. A bipolar transistor according to claim 9, wherein a thickness of the base metal contacts is substantially uniformly greater than 3 μm.

11. A bipolar transistor according to claim 10, wherein a thickness of the emitter metal contacts is substantially uniformly greater than 3 μm.

12. A bipolar transistor according to claim 1, wherein the first conductivity type is a conductivity opposite a conductivity of the second conductivity type.

13. A method of manufacturing a bipolar transistor having reduced saturation resistance, the method comprising:

providing a bipolar transistor including a base region and an emitter region; and providing a metal layer having metal track contacts that directly contact the base region and the emitter region;

the bipolar transistor having a specific area resistance of less than 500 mOhms·mm$^2$ when the metal layer has a thickness of less than 3 μm;

wherein the thickness of the metal layer is substantially uniformly greater than 3 μm to reduce voltage drops in the metal track contacts, which contact the base region and the emitter region, to provide substantially even biasing of a junction of the base region and the emitter region such that saturation resistance is reduced by an amount greater than 0% and up to 30%.

14. The method according to claim 13, wherein the thickness of the metal layer is no less than 4 μm.

* * * * *